US012761542B2

(12) United States Patent
Nakagawa

(10) Patent No.: US 12,761,542 B2
(45) Date of Patent: Oct. 13, 2026

(54) REFLECTIVE MASK BLANK, REFLECTIVE MASK, METHOD FOR MANUFACTURING REFLECTIVE MASK, AND METHOD FOR MANUFACTURING SEMICONDUCTOR DEVICE

(71) Applicant: HOYA CORPORATION, Tokyo (JP)

(72) Inventor: Masanori Nakagawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 567 days.

(21) Appl. No.: 18/282,493

(22) PCT Filed: Mar. 25, 2022

(86) PCT No.: PCT/JP2022/014309
§ 371 (c)(1),
(2) Date: Sep. 15, 2023

(87) PCT Pub. No.: WO2022/210334
PCT Pub. Date: Oct. 6, 2022

(65) Prior Publication Data

US 2024/0142866 A1 May 2, 2024

(30) Foreign Application Priority Data

Mar. 29, 2021 (JP) ................................. 2021-054851

(51) Int. Cl.
*G03F 1/24* (2012.01)
*G03F 1/48* (2012.01)
*G03F 1/54* (2012.01)

(52) U.S. Cl.
CPC .................. *G03F 1/24* (2013.01); *G03F 1/48* (2013.01); *G03F 1/54* (2013.01)

(58) Field of Classification Search
CPC ..... G03F 1/24; G03F 1/48; G03F 1/54; G03F 7/20; G03F 1/38; G03F 7/2004; H10P 76/2041
(Continued)

(56) References Cited

U.S. PATENT DOCUMENTS

2003/0162005 A1 8/2003 Shoki
2007/0090084 A1 4/2007 Yan et al.
(Continued)

FOREIGN PATENT DOCUMENTS

JP 2003257824 A 9/2003
JP 2011187746 A 9/2011
(Continued)

OTHER PUBLICATIONS

PCT/JP2022/014309, "English Translation of International Search Report", Jun. 14, 2022, 2 pages.
(Continued)

*Primary Examiner* — Caleen O Sullivan
(74) *Attorney, Agent, or Firm* — Sughrue Mion, PLLC

(57) ABSTRACT

Provided are a reflective mask blank, a reflective mask, a method for manufacturing a reflective mask, and a method for manufacturing a semiconductor device, capable of preventing occurrence of electrostatic breakdown in a substrate peripheral edge portion.
The reflective mask blank comprises a substrate, a multilayer reflective film on the substrate, a protective film on the multilayer reflective film, and an absorber film on the protective film. The absorber film comprises a buffer layer and an absorption layer formed on the buffer layer. When a distance from a center of the substrate to an outer peripheral end of the protective film is denoted by Lcap, and a distance from the center of the substrate to an outer peripheral end of the buffer layer is denoted by Lbuf, Lcap≤Lbuf is satisfied.
(Continued)

There is at least one location where a total film thickness of the protective film and the buffer layer is 4.5 nm or more in a range of 0.5 mm or less from a side surface of the substrate 10 toward the center of the substrate.

18 Claims, 7 Drawing Sheets

(58) Field of Classification Search
USPC .............................................................. 430/5
See application file for complete search history.

(56) References Cited

U.S. PATENT DOCUMENTS

| | | | | |
|---|---|---|---|---|
| 2014/0186753 | A1 | 7/2014 | Okamura et al. | |
| 2015/0301441 | A1 | 10/2015 | Hamamoto et al. | |
| 2020/0004133 | A1 | 1/2020 | Hsu et al. | |
| 2021/0373430 | A1* | 12/2021 | Tsai | G03F 1/54 |
| 2022/0121102 | A1* | 4/2022 | Shoki | G03F 1/24 |
| 2024/0160095 | A1* | 5/2024 | Nakagawa | G03F 1/24 |

FOREIGN PATENT DOCUMENTS

| | | | |
|---|---|---|---|
| TW | 202001407 | A | 1/2020 |
| WO | 2013031863 | A1 | 3/2013 |
| WO | 2014021235 | A1 | 2/2014 |

OTHER PUBLICATIONS

Office Action issued Aug. 28, 2026 in the corresponding Taiwanese patent application No. 114147646.

* cited by examiner

REFLECTIVE MASK BLANK, REFLECTIVE MASK, METHOD FOR MANUFACTURING REFLECTIVE MASK, AND METHOD FOR MANUFACTURING SEMICONDUCTOR DEVICE

CROSS-REFERENCE TO RELATED APPLICATIONS

This application is the National Stage of International Application No. PCT/JP2022/014309, filed Mar. 25, 2022, which claims priority to Japanese Patent Application No. 2021-054851, filed Mar. 29, 2021, and the contents of which are incorporated by reference.

TECHNICAL FIELD

The present disclosure relates to a reflective mask blank, a reflective mask, a method for manufacturing a reflective mask, and a method for manufacturing a semiconductor device.

BACKGROUND ART

With a further demand for higher density and higher accuracy of a VLSI device in recent years, extreme ultraviolet (hereinafter referred to as "EUV") lithography, which is an exposure technique using EUV light, is promising. The EUV light refers to light in a wavelength band of a soft X-ray region or a vacuum ultraviolet region, and is specifically light having a wavelength of about 0.2 to 100 nm.

A reflective mask includes a multilayer reflective film for reflecting exposure light formed on a substrate, and an absorber pattern which is a patterned absorber film formed on the multilayer reflective film for absorbing exposure light. Light incident on the reflective mask mounted on an exposure machine for performing pattern transfer on a semiconductor substrate is absorbed in a portion having an absorber pattern, and is reflected by the multilayer reflective film in a portion having no absorber pattern. A light image reflected by the multilayer reflective film is transferred onto a semiconductor substrate such as a silicon wafer through a reflective optical system.

As the multilayer reflective film, a multilayer film in which elements having different refractive indices are periodically layered is used. For example, as a multilayer reflective film for EUV light having a wavelength of 13 nm to 14 nm, a Mo/Si periodic layered film in which a Mo film and a Si film are alternately layered for about 40 periods is preferably used.

Patent Document 1 discloses a reflective mask blank in which a multilayer reflective film that reflects EUV light, a protective film for protecting the multilayer reflective film, an absorber film that absorbs EUV light, and a resist film are sequentially formed on a substrate, in which when a distance from a center of the substrate to an outer peripheral end of the multilayer reflective film is denoted by L (ML), a distance from the center of the substrate to an outer peripheral end of the protective film is denoted by L (Cap), a distance from the center of the substrate to an outer peripheral end of the absorber film is denoted by L (Abs), and a distance from the center of the substrate to an outer peripheral end of the resist film is denoted by L (Res), $L (Abs)>L (Res)>L (Cap)\geq L (ML)$ is satisfied, and the outer peripheral end of the resist film is closer to a center side than an outer peripheral end of the substrate.

Patent Document 2 discloses an exposure reflective mask blank including a substrate, a multilayer reflective film that is sequentially formed on the substrate and reflects exposure light, and an absorption film that absorbs exposure light, in which the multilayer reflective film is formed by alternately building up a heavy element material film and a light element material film having different refractive indexes, and the exposure reflective mask blank includes a protective layer that protects at least a peripheral end portion of the heavy element material film in the multilayer reflective film. In addition, Patent Document 2 describes that an absorption film is formed in a film forming region larger than a film forming region of the multilayer reflective film.

PRIOR ART DOCUMENTS

Patent Documents

Patent Document 1: WO 2014/021235 A
Patent Document 2: JP 2003-257824 A

SUMMARY OF DISCLOSURE

Technical Problem

A reflective mask blank generally has a structure in which a multilayer reflective film that reflects exposure light (EUV light) is formed on one main surface of a substrate, and an absorber film that absorbs exposure light (EUV light) is formed on the multilayer reflective film. In a case of manufacturing a reflective mask using a reflective mask blank, first, a resist film for electron beam drawing is formed on a surface of the reflective mask blank. Next, a desired pattern is drawn on the resist film with an electron beam, and the pattern is developed to form a resist pattern. Next, using the resist pattern as a mask, the absorber film is dry-etched to form an absorber pattern (transfer pattern). As a result, it is possible to manufacture a reflective mask in which the absorber pattern is formed on the multilayer reflective film.

FIG. 14 is an enlarged cross-sectional view of an outer peripheral end portion of a conventional reflective mask blank 200. As illustrated in FIG. 14, the reflective mask blank 200 includes a substrate 210, a multilayer reflective film 212 formed on the substrate 210, a protective film 214 formed on the multilayer reflective film 212, an absorber film 216 formed on the protective film 214, an etching mask film 218 formed on the absorber film 216, and a resist film 220 formed on the etching mask film 218. The protective film 214 has a function of protecting the multilayer reflective film 212 from dry etching and cleaning in a reflective mask manufacturing process. The etching mask film 218 is a film for dry-etching the absorber film 216 to form an absorber pattern (transfer pattern). The resist film 220 is a film for forming a pattern on the etching mask film 218. Note that when the etching mask film 218 is not formed, a resist pattern is formed on the resist film 220, and the absorber film 216 is dry-etched using the resist pattern as a mask to form an absorber pattern (transfer pattern).

The resist film 220 is formed on the entire surface of the reflective mask blank 200, and in order to suppress the resist film 220 from being peeled off and generating dust in a peripheral edge portion of the substrate 210, the resist film 220 in the substrate peripheral edge portion where a mask pattern is not formed is usually removed (edge rinse). This edge rinse is performed, for example, by removing the resist film 220 having a width of about 1 to 1.5 mm along the peripheral edge portion of the substrate 210 with a resist peeling liquid. As illustrated in FIG. 14, in a region R from which the resist film 220 has been removed by the edge rinse, the etching mask film 218 under the resist film 220 is exposed.

In a reflective mask using EUV light as exposure light, it is important to accurately manage the position of a defect present on a multilayer reflective film. This is because the defect present on the multilayer reflective film is hardly correctable and can be a serious phase defect on a transfer pattern. Therefore, in the reflective mask blank 200, a mark serving as a reference for managing the position of the defect on the multilayer reflective film 212 may be formed. This reference mark may also be referred to as a fiducial mark.

FIG. 15 is an enlarged cross-sectional view of an outer peripheral end portion of the reflective mask blank 200 in which a reference mark FM is formed. As illustrated in FIG. 15, the reference mark FM is formed in a region outside a region PA where a pattern is formed on the absorber film 216. When the reference mark FM is formed, first, a resist pattern 220*a* for forming the reference mark FM is formed on the resist film 220 by electron beam drawing, and the etching mask film 218 and the absorber film 216 are etched by dry etching using the resist pattern 220*a* as a mask to form the reference mark FM.

As described above, in the region R from which the resist film 220 has been removed by the edge rinse, the etching mask film 218 under the resist film 220 is exposed. Therefore, the etching mask film 218 and the absorber film 216 in the region R from which the resist film 220 has been removed are removed by dry etching at the time of forming the reference mark FM, and therefore the protective film 214 under the absorber film 216 is exposed. At this time, the exposed protective film 214 is damaged by etching, and an isolated island-shaped protective film 214*a* may be thereby formed as illustrated in FIG. 16. The isolated island-shaped protective film 214*a* is a portion separated from a periphery thereof, and is a portion not connected to a protective film 214*b* on a center side of the substrate 210.

When the isolated island-shaped protective film 214*a* is formed, the isolated island-shaped protective film 214*a* is charged at the time of electron beam drawing for forming a pattern on the absorber film 216. When the isolated island-shaped protective film 214*a* is charged, since the isolated island-shaped protective film 214*a* does not include a means (for example, a conductive pin) for releasing the charge, the charge may be released from the isolated island-shaped protective film 214*a* at once to cause electrostatic breakdown. When the reflective mask blank 200 is damaged by electrostatic breakdown, the reflective mask blank 200 cannot be used as a product, which has been problematic.

The present disclosure has been made in order to solve the above-described problems, and an aspect of the present disclosure is to provide a reflective mask blank, a reflective mask, a method for manufacturing a reflective mask, and a method for manufacturing a semiconductor device, capable of preventing occurrence of electrostatic breakdown in a substrate peripheral edge portion.

Solution to Problem

In order to solve the above problems, the present disclosure has the following configurations.

(Configuration 1) A reflective mask blank comprising: a substrate; a multilayer reflective film on the substrate; a protective film on the multilayer reflective film; and an absorber film on the protective film, in which the absorber film comprises a buffer layer and an absorption layer formed on the buffer layer, when a distance from a center of the substrate to an outer peripheral end of the protective film is denoted by Lcap, and a distance from the center of the substrate to an outer peripheral end of the buffer layer is denoted by Lbuf, Lcap≤Lbuf is satisfied, and in a range of 0.5 mm or less from a side surface of the substrate toward the center of the substrate, there is at least one location where a total film thickness of the protective film and the buffer layer is 4.5 nm or more.

(Configuration 2) The reflective mask blank according to configuration 1, in which the buffer layer comprises at least one selected from tantalum (Ta), silicon (Si), chromium (Cr), iridium (Ir), platinum (Pt), palladium (Pd), zirconium (Zr), hafnium (Hf), and yttrium (Y).

(Configuration 3) The reflective mask blank according to configuration 1 or 2, in which a total film thickness of the protective film and the buffer layer at the center of the substrate is 4.5 nm or more and 35 nm or less.

(Configuration 4) The reflective mask blank according to any one of configurations 1 to 3, in which when a distance from the center of the substrate to an outer peripheral end of the absorption layer is denoted by Labs, Lcap≤Labs is satisfied.

(Configuration 5) The reflective mask blank according to any one of configurations 1 to 4, in which the protective film comprises ruthenium (Ru).

(Configuration 6) The reflective mask blank according to any one of configurations 1 to 5, comprising a resist film on the absorber film, in which when a distance from the center of the substrate to an outer peripheral end of the resist film is denoted by Lres, Lres<Lcap≤Lbuf is satisfied.

(Configuration 7)

A reflective mask comprising an absorber pattern in which the absorption layer in the reflective mask blank according to any one of configurations 1 to 6 is patterned.

(Configuration 8) The reflective mask according to configuration 7, in which a reference mark is formed in the absorption layer in the absorber film.

(Configuration 9) A method for manufacturing a reflective mask, the method comprising patterning the absorption layer of the reflective mask blank according to any one of configurations 1 to 6 to form an absorber pattern.

(Configuration 10)

A method for manufacturing a semiconductor device, the method comprising setting the reflective mask according to configuration 7 or 8 in an exposure apparatus comprising an exposure light source that emits EUV light and transferring a transfer pattern onto a resist film formed on a transferred substrate.

Advantageous Effects of Disclosure

According to the present disclosure, it is possible to provide a reflective mask blank, a reflective mask, a method for manufacturing a reflective mask, and a method for manufacturing a semiconductor device, capable of preventing occurrence of electrostatic breakdown in a substrate peripheral edge portion.

DESCRIPTION OF EMBODIMENTS

Hereinafter, an embodiment of the present disclosure will be specifically described with reference to the drawings. Note that the following embodiment is a mode for specifically describing the present disclosure and does not limit the present disclosure within the scope thereof.

Figure 1:
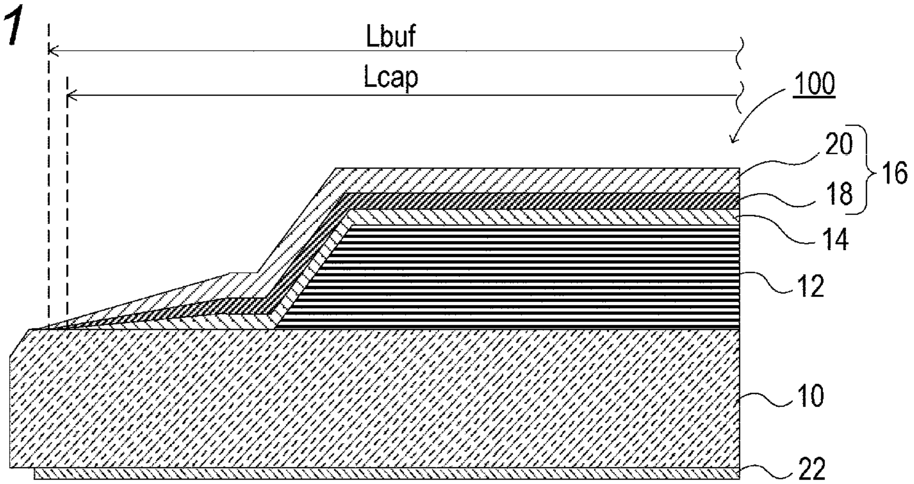
FIG. 1 is a schematic cross-sectional view illustrating an example of a reflective mask blank of the present embodiment, and is an enlarged view of an outer peripheral end portion of a substrate.

FIG. 1 is a schematic cross-sectional view illustrating an example of a reflective mask blank 100 of the present embodiment, and is an enlarged view of an outer peripheral end portion of a substrate 10. The reflective mask blank 100 illustrated in FIG. 1 includes the substrate 10, a multilayer reflective film 12 formed on the substrate 10, a protective film 14 formed on the multilayer reflective film 12, and an absorber film 16 formed on the protective film 14. The absorber film 16 has a two-layer structure, and includes a buffer layer 18 formed so as to be in contact with the protective film 14 and an absorption layer 20 formed on the buffer layer 18. A conductive back film 22 for electrostatic chuck may be formed on a back surface of the substrate 10 (surface opposite to a side where the multilayer reflective film 12 is formed).

Note that, in the present specification, "on" a substrate or a film includes not only a case of being in contact with a top surface of the substrate or the film but also a case of being not in contact with the top surface of the substrate or the film. That is, "on" a substrate or a film includes a case where a new film is formed above the substrate or the film, a case where another film is interposed between the substrate or the film and an object "on" the substrate or the film, and the like. In addition, "on" does not necessarily mean an upper side in the vertical direction. "On" merely indicates a relative positional relationship among a substrate, a film, and the like.

<Substrate>

As the substrate 10, a substrate having a low thermal expansion coefficient within a range of 0±5 ppb/° C. is preferably used in order to prevent distortion of a transfer pattern due to heat during exposure to EUV light. As a material having a low thermal expansion coefficient within this range, for example, $SiO_2$—$TiO_2$-based glass or multi-component-based glass ceramic can be used.

A main surface of the substrate 10 on a side where a transfer pattern (absorber pattern described later) is formed is preferably processed in order to increase a flatness. By increasing the flatness of the main surface of the substrate 10, position accuracy and transfer accuracy of the pattern can be increased. For example, in a case of EUV exposure, the flatness in a region of 132 mm×132 mm of the main surface of the substrate 10 on the side where the transfer pattern is formed is preferably 0.1 μm or less, more preferably 0.05 μm or less, and particularly preferably 0.03 μm or less. A main surface (back surface) on a side opposite to the side where the transfer pattern is formed is a surface to be fixed to an exposure apparatus by electrostatic chuck, and the flatness in a region of 142 mm×142 mm of the main surface (back surface) is preferably 0.1 μm or less, more preferably 0.05 μm or less, and particularly preferably 0.03 μm or less. Note that here, the flatness is a value indicating warp (deformation amount) of a surface, expressed by total indicated reading (TIR), and an absolute value of a difference in height between the highest position of a substrate surface above a focal plane and the lowest position of the substrate surface below the focal plane, in which the focal plane is a plane defined by a minimum square method using the substrate surface as a reference.

In a case of EUV exposure, the main surface of the substrate 10 on the side where the transfer pattern is formed preferably has a surface roughness of 0.1 nm or less in terms of root mean square roughness (Rq). Note that the surface roughness can be measured with an atomic force microscope.

The substrate 10 preferably has a high rigidity in order to prevent deformation of a film (such as the multilayer reflective film 12) formed on the substrate 10 due to a film stress. In particular, the substrate 10 preferably has a high Young's modulus of 65 GPa or more.

<Multilayer Reflective Film>

The multilayer reflective film 12 has a structure in which a plurality of layers mainly containing elements having different refractive indices is periodically layered. Generally, the multilayer reflective film 12 is formed of a multilayer film in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods.

In order to form the multilayer reflective film 12, the high refractive index layer and the low refractive index layer may be layered in this order from the substrate 10 side for a plurality of periods. In this case, one (high refractive index layer/low refractive index layer) stack is one period.

Note that an uppermost layer of the multilayer reflective film 12, that is, a surface layer of the multilayer reflective film 12 on a side opposite to the substrate 10 is preferably the high refractive index layer. When the high refractive index layer and the low refractive index layer are built up in this order from the substrate 10 side, the uppermost layer is the low refractive index layer. However, when the low refractive index layer forms a surface of the multilayer reflective film 12, the reflectance of the surface of the multilayer reflective film 12 is reduced due to easy oxidation of the low refractive index layer. Therefore, the high refractive index layer is preferably formed on the low refractive index layer. Meanwhile, when the low refractive index layer and the high refractive index layer are built up in this order from the substrate 10 side, the uppermost layer is the high refractive index layer. In this case, the high refractive index layer forming the uppermost layer forms a surface of the multilayer reflective film 12.

The high refractive index layer included in the multilayer reflective film 12 is a layer made of a material containing Si. The high refractive index layer may contain a simple substance of Si or a Si compound. The Si compound may contain Si and at least one element selected from the group consisting of B, C, N, O, and H. By using the layer containing Si as the high refractive index layer, a multilayer reflective film having an excellent reflectance of EUV light can be obtained.

The low refractive index layer included in the multilayer reflective film 12 is a layer made of a material containing a transition metal. The transition metal contained in the low refractive index layer is preferably at least one transition metal selected from the group consisting of Mo, Ru, Rh, and Pt. The low refractive index layer is more preferably a layer made of a material containing Mo.

For example, as the multilayer reflective film 12 for EUV light having a wavelength of 13 to 14 nm, a Mo/Si multilayer film in which a Mo film and a Si film are alternately layered for about 40 to 60 periods can be preferably used.

The reflectance of such a multilayer reflective film 12 alone is, for example, 65% or more. An upper limit of the reflectance of the multilayer reflective film 12 is, for example, 73%. Note that the thicknesses and period of layers included in the multilayer reflective film 12 can be selected so as to satisfy Bragg's law.

The multilayer reflective film 12 can be formed by a known method. The multilayer reflective film 12 can be formed by, for example, an ion beam sputtering method.

For example, when the multilayer reflective film 12 is a Mo/Si multilayer film, a Mo film having a thickness of about 3 nm is formed on the substrate 10 by an ion beam sputtering method using a Mo target. Next, a Si film having a thickness of about 4 nm is formed using a Si target. By repeating such an operation, the multilayer reflective film 12 in which Mo/Si films are layered for 40 to 60 periods can be formed. At this time, a surface layer of the multilayer reflective film 12 on a side opposite to the substrate 10 is a layer containing Si (Si film). The Mo/Si film in one period has a thickness of 7 nm.

<Protective Film>

The reflective mask blank 100 of the present embodiment includes the protective film 14 formed on the multilayer reflective film 12. The protective film 14 has a function of protecting the multilayer reflective film 12 from dry etching and cleaning in a reflective mask 110 manufacturing process described later. The protective film 14 also has a function of protecting the multilayer reflective film 12 when a black defect in a transfer pattern is corrected using an electron beam (EB). By forming the protective film 14 on the multilayer reflective film 12, damage to a surface of the multilayer reflective film 12 can be suppressed when the reflective mask 110 is manufactured. As a result, a reflectance characteristic of the multilayer reflective film 12 with respect to EUV light is improved.

The protective film 14 can be formed by a known method. Examples of a method for forming the protective film 14 include an ion beam sputtering method, a magnetron sputtering method, a reactive sputtering method, a vapor phase growth method (CVD), and a vacuum vapor deposition method. The protective film 14 may be continuously formed by an ion beam sputtering method after the multilayer reflective film 12 is formed.

The protective film 14 can be made of a material having different etching selectivity from the buffer layer 18. Examples of the material of the protective film 14 include Ru, Ru—(Nb, Rh, Zr, Y, B, Ti, La, Mo), Si—(Ru, Rh, Cr, B), Si, Zr, Nb, La, and B. Among these materials, when a material containing ruthenium (Ru) is applied, a reflectance characteristic of the multilayer reflective film 12 is further improved. Specifically, the material of the protective film 14 is preferably Ru or Ru—(Nb, Rh, Zr, Y, B, Ti, La, Mo). Such a protective film 14 is particularly effective in a case where the buffer layer 18 is patterned by dry etching with a chlorine-based gas or a fluorine-based gas.

<Absorber Film>

As described above, the absorber film 16 includes the buffer layer 18 formed so as to be in contact with the protective film 14 and the absorption layer 20 formed on the buffer layer 18.

A basic function of the absorber film 16 (including the absorption layer 20 and the buffer layer 18) is to absorb EUV light. The absorber film 16 may be the absorber film 16 for the purpose of absorbing EUV light, or may be the absorber film 16 having a phase shift function in consideration of a phase difference of EUV light. The absorber film 16 having a phase shift function absorbs EUV light and reflects a part of the EUV light to shift a phase. That is, in the reflective mask in which the absorber film 16 having a phase shift function is patterned, in a portion where the absorber film 16 is formed, a part of light is reflected at a level that does not adversely affect pattern transfer while EUV light is absorbed and attenuated. In addition, in a region (field portion) where the absorber film 16 is not formed, EUV light is reflected by the multilayer reflective film 12 via the protective film 14. Therefore, a desired phase difference is generated between reflected light from the absorber film 16 having a phase shift function and reflected light from the field portion. The absorber film 16 having a phase shift function is preferably formed such that a phase difference between reflected light from the absorber film 16 and reflected light from the multilayer reflective film 12 is 170 to 190 degrees. Beams of light having a reversed phase difference around 180 degrees interfere with each other at a pattern edge portion to improve an image contrast of a projected optical image. As the image contrast is improved, resolution is increased, and various exposure-related margins such as an exposure margin and a focus margin can be increased.

The absorption layer 20 in the absorber film 16 is a film mainly having the function of the absorber film 16 described above, and may be a single-layer film or a multilayer film including a plurality of films. In a case of a single layer film, the number of steps at the time of manufacturing the mask blank can be reduced, and manufacturing efficiency is increased. In a case of the multilayer film, an optical constant of an upper absorption layer and the film thickness thereof can be appropriately set such that the upper absorption layer serves as an antireflection film at the time of mask pattern defect inspection using light. This improves inspection sensitivity at the time of mask pattern defect inspection using light. In addition, when a film containing oxygen (O), nitrogen (N), and the like that improve oxidation resistance is used as the upper absorption layer, temporal stability is improved. As described above, by forming the absorption layer 20 into a multilayer film, various functions can be added to the absorption layer 20. When the absorption layer 20 has a phase shift function, by forming the absorption layer 20 into a multilayer film, a range of adjustment on an optical surface can be increased, and therefore a desired reflectance can be easily obtained.

A material of the absorption layer 20 is not particularly limited as long as the material has a function of absorbing EUV light, can be processed by etching or the like (preferably, can be etched by dry etching with a chlorine (Cl)-based gas and/or a fluorine (F)-based gas), and has a high etching selective ratio to the buffer layer 18. As a material having such a function, at least one metal selected from palladium (Pd), silver (Ag), platinum (Pt), gold (Au), iridium (Ir), tungsten (W), chromium (Cr), cobalt (Co), manganese (Mn), tin (Sn), tantalum (Ta), vanadium (V), nickel (Ni), hafnium (Hf), iron (Fe), copper (Cu), tellurium (Te), zinc (Zn), magnesium (Mg), germanium (Ge), aluminum (Al), rhodium (Rh), ruthenium (Ru), molybdenum (Mo), niobium (Nb), titanium (Ti), zirconium (Zr), yttrium (Y), and silicon (Si), or a compound thereof can be preferably used.

The absorption layer 20 can be formed by a magnetron sputtering method such as a DC sputtering method or an RF sputtering method. For example, the absorption layer 20 such as a tantalum compound can be formed by a reactive sputtering method using a target containing tantalum and boron and using an argon gas containing oxygen or nitrogen.

The tantalum compound for forming the absorption layer 20 includes an alloy made of Ta and the above-described metal. When the absorption layer 20 is an alloy of Ta, the crystalline state of the absorption layer 20 is preferably an amorphous or microcrystalline structure from a viewpoint of smoothness and flatness. When a surface of the absorption layer 20 is not smooth or not flat, an absorber pattern described later may have a large edge roughness and a poor pattern dimensional accuracy. The absorption layer 20 has a surface roughness of preferably 0.5 nm or less, more preferably 0.4 nm or less, still more preferably 0.3 nm or less in terms of root mean square roughness (Rms).

Examples of the tantalum compound for forming the absorption layer 20 include a compound containing Ta and B, a compound containing Ta and N, a compound containing Ta, O, and N, a compound containing Ta and B and further containing at least either O or N, a compound containing Ta and Si, a compound containing Ta, Si, and N, a compound containing Ta and Ge, a compound containing Ta, Ge, and N, and the like.

Ta is a material that has a large absorption coefficient of EUV light and can be easily dry-etched with a chlorine-based gas or a fluorine-based gas. Therefore, Ta can be said to be a material having excellent processability for the absorption layer 20. By further adding B, Si, and/or Ge, or the like to Ta, an amorphous material can be easily obtained. As a result, the smoothness of the absorption layer 20 can be improved. In addition, when N and/or O is added to Ta, resistance of the absorption layer 20 to oxidation is improved, and therefore stability of the absorption layer 20 over time can be improved.

<Etching Mask Film>

Figure 2:
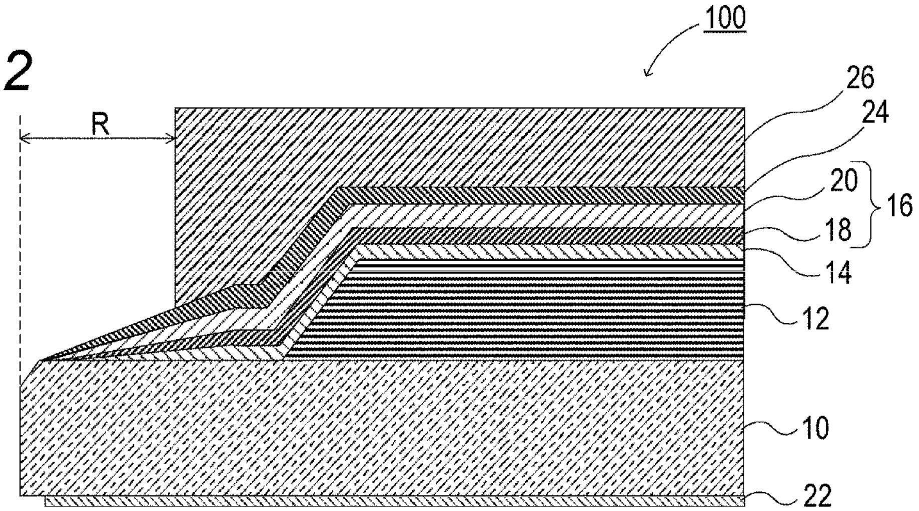
FIG. 2 is a schematic cross-sectional view illustrating another example of the reflective mask blank of the present embodiment, and is an enlarged view of an outer peripheral end portion of a substrate.

FIG. 2 is a schematic cross-sectional view illustrating another example of the reflective mask blank 100 of the present embodiment, and is an enlarged view of an outer peripheral end portion of the substrate 10. As illustrated in FIG. 2, the reflective mask blank 100 can further include another thin film such as a resist film 26 on the absorber film 16. In addition, the reflective mask blank 100 may further include an etching mask film 24 between the absorption layer 20 and the resist film 26.

As a material of the etching mask film 24, a material having a high etching selective ratio of the absorption layer 20 to the etching mask film 24 is preferably used. The etching selective ratio of the absorption layer 20 to the etching mask film 24 is preferably 1.5 or more, and more preferably 3 or more.

The reflective mask blank 100 of the present embodiment preferably includes the etching mask film 24 containing chromium (Cr) on the absorption layer 20. When the absorption layer 20 is etched with a fluorine-based gas, as a material of the etching mask film 24, chromium or a chromium compound is preferably used. Examples of the chromium compound include a material containing Cr and at least one element selected from N, O, C, and H. The etching mask film 24 more preferably contains CrN, CrO, CrC, CrON, CrOC, CrCN, or CrOCN, and particularly preferably uses a material containing Cr, N, and/or O. Specific examples of such a material include CrN, CrO, CrON, and the like.

When the absorption layer 20 is etched with a chlorine-based gas substantially containing no oxygen or when the absorption layer 20 is etched with a mixed gas of a chlorine-based gas and an oxygen gas, silicon or a silicon compound is preferably used as a material of the etching mask film 24. Examples of the silicon compound include a material containing Si and at least one element selected from N, O, C, and H, a metallic silicon containing a metal in silicon or a silicon compound (metal silicide), a metal silicon compound (metal silicide compound), and the like. Examples of the metal silicon compound include a material containing a metal, Si, and at least one element selected from N, O, C, and H. Among these, it is particularly preferable to use a material containing Si, N, and/or O as the material of the etching mask film 24. Specific examples of such a material include SiN, SiO, and the like.

When the absorption layer 20 is etched with a chlorine-based gas substantially containing no oxygen or when the absorption layer 20 is etched with a mixed gas of a chlorine-based gas and an oxygen gas, the etching mask film 24 containing tantalum (Ta) can be used. Examples of a material containing Ta include a material containing Ta and one or more elements selected from O, N, C, B, and H. Among these, it is particularly preferable to use a material containing Ta and O as the material of the etching mask film 24. Specific examples of such a material include TaO, TaON, TaBO, TaBON, and the like.

In addition, as the material of the etching mask film 24, at least one metal selected from iridium (Ir), platinum (Pt), palladium (Pd), zirconium (Zr), hafnium (Hf), and yttrium (Y), or a compound thereof may be used.

The film thickness of the etching mask film 24 is preferably 3 nm or more in order to accurately form a pattern on the absorption layer 20. In addition, the film thickness of the etching mask film 24 is desirably 15 nm or less in order to reduce the film thickness of a resist film 26.

<Conductive Back Film>

A conductive back film 22 for electrostatic chuck may be formed on a back surface of the substrate 10 (a surface opposite to a side where the multilayer reflective film 12 is formed). Sheet resistance required for the conductive back film 22 for electrostatic chuck is usually 100Ω/□ (Ω/square) or less. The conductive back film 22 can be formed, for example, by a magnetron sputtering method or an ion beam sputtering method using a target of a metal such as chromium or tantalum or an alloy thereof. A material of the conductive back film 22 is preferably a material containing chromium (Cr) or tantalum (Ta). For example, the material of the conductive back film 22 is preferably a Cr compound containing Cr and at least one selected from boron, nitrogen, oxygen, and carbon. Examples of the Cr compound include CrN, CrON, CrCN, CrCON, CrBN, CrBON, CrBCN, CrBOCN, and the like. In addition, the material of the conductive back film 22 is preferably Ta (tantalum), an alloy containing Ta, or a Ta compound containing either Ta or an alloy containing Ta and at least one of boron, nitrogen, oxygen, and carbon. Examples of the Ta compound include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON, and the like.

The film thickness of the conductive back film 22 is not particularly limited as long as the conductive back film 22 functions as a film for electrostatic chuck, but is, for example, 10 nm to 200 nm.

Hereinafter, the above-described buffer layer 18 will be described in detail.

As illustrated in FIG. 2, the resist film 26 is formed on the entire surface of the reflective mask blank 100, and in order to suppress the resist film 26 from being peeled off and generating dust in a peripheral edge portion of the substrate 10, the resist film 26 in the substrate peripheral edge portion where a mask pattern is not formed is usually removed (edge rinse). In a region R from which the resist film 26 has been removed by the edge rinse, the etching mask film 24 under the resist film 26 is exposed. Note that in a case of the reflective mask blank 100 without the etching mask film 24, the absorption layer 20 is exposed.

In a reflective mask using EUV light as exposure light, it is important to accurately manage the position of a defect present on the multilayer reflective film 12. This is because the defect present on the multilayer reflective film 12 is hardly correctable and can be a serious phase defect on a transfer pattern. Therefore, in the reflective mask blank 100, a mark serving as a reference for managing the position of the defect on the multilayer reflective film 12 may be formed. This reference mark may also be referred to as a fiducial mark.

Figure 3:
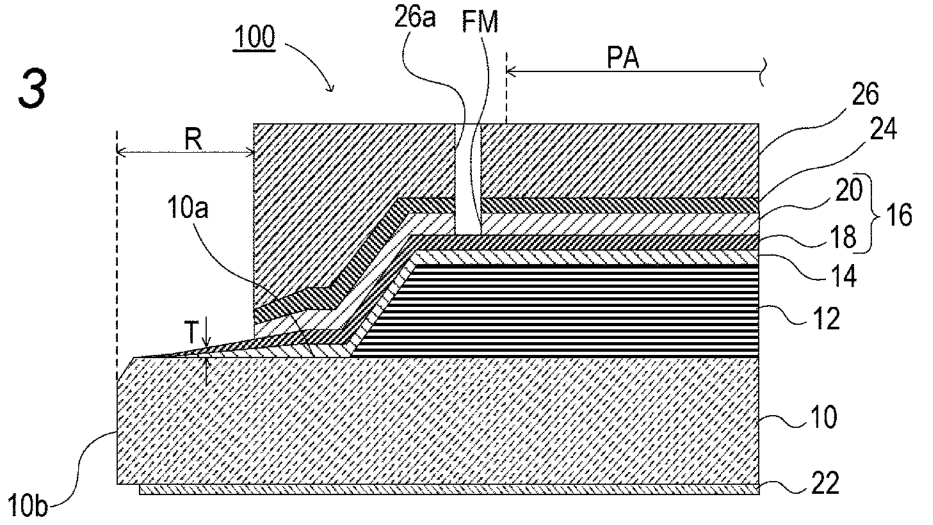
FIG. 3 is an enlarged cross-sectional view of an outer peripheral end portion of a reflective mask blank in which a reference mark is formed.

FIG. 3 is an enlarged cross-sectional view of an outer peripheral end portion of the reflective mask blank 100 in which a reference mark FM is formed. As illustrated in FIG. 3, the reference mark FM is formed in a region outside a region PA where a pattern is formed on the absorption layer 20. When the reference mark FM is formed, first, a resist pattern 26*a* for forming the reference mark FM is formed on the resist film 26 by electron beam drawing, and the etching mask film 24 and the absorption layer 20 are etched by dry etching using the resist pattern 26*a* as a mask to form the reference mark FM.

As described above, in the region R from which the resist film 26 has been removed by the edge rinse, the etching mask film 24 (or the absorption layer 20) under the resist film 26 is exposed. Therefore, the etching mask film 24 and the absorption layer 20 in the region R from which the resist film 26 has been removed are removed by dry etching at the time of forming the reference mark FM in the absorption layer 20.

In the reflective mask blank 100 of the present embodiment, the absorber film 16 includes the buffer layer 18 formed so as to be in contact with the protective film 14 and the absorption layer 20 formed on the buffer layer 18. The buffer layer 18 is a layer having etching resistance to the absorption layer 20 and is a layer for preventing formation of an isolated island-shaped protective film.

Therefore, even when the etching mask film 24 and the absorption layer 20 are removed by dry etching at the time of forming the reference mark FM in the region R from which the resist film 26 has been removed by the edge rinse, the buffer layer 18 remains on the protective film 14. Therefore, it is possible to prevent the protective film 14 from being damaged by etching.

The buffer layer 18 can be formed by a known film forming method. The buffer layer 18 can be formed, for example, by a magnetron sputtering method such as a DC sputtering method or an RF sputtering method.

A material of the buffer layer 18 is not particularly limited, but is preferably a material having resistance to an etchant used for dry etching at the time of forming the reference mark FM in the absorption layer 20. The buffer layer 18 can be made of, for example, the same material as that of the etching mask film 24 described above. The buffer layer 18 preferably contains at least one selected from tantalum (Ta), silicon (Si), chromium (Cr), iridium (Ir), platinum (Pt), palladium (Pd), zirconium (Zr), hafnium (Hf), and yttrium (Y). In addition, in a case of the reflective mask blank 100 having the etching mask film 24, the buffer layer 18 is preferably made of the same material as that of the etching mask film 24.

According to the reflective mask blank 100 of the present embodiment, since the buffer layer 18 remains on the protective film 14, it is possible to prevent the protective film 14 from being damaged by dry etching at the time of forming the reference mark FM. For this reason, it is possible to prevent generation of an "isolated island-shaped protective film" that has been conventionally generated at the time of forming the reference mark FM, and it is possible to prevent occurrence of electrostatic breakdown due to charging of the isolated island-shaped protective film.

In the reflective mask blank 100 of the present embodiment, when a distance from a center of the substrate 10 to an outer peripheral end of the protective film 14 is denoted by Lcap, and a distance from the center of the substrate 10 to an outer peripheral end of the buffer layer 18 is denoted by Lbuf, Lcap≤Lbuf is satisfied. When the protective film 14 and the buffer layer 18 satisfy such a condition, the buffer layer 18 remains on the protective film 14 in the region R from which the resist film 26 has been removed by the edge rinse. Since the buffer layer 18 remains on the protective film 14, it is possible to prevent generation of the isolated island-shaped protective film 14 in the region R from which the resist film 26 has been removed by the edge rinse.

In the reflective mask blank 100 of the present embodiment, there is at least one location where a total film thickness T of the protective film 14 and the buffer layer 18 is 4.5 nm or more in a range of 0.5 mm or less from a side surface of the substrate 10 toward a center of the substrate 10. When the protective film 14 and the buffer layer 18 satisfy such a condition, in the region R from which the resist film 26 has been removed by the edge rinse (The region R is usually a region having a width of about 1 to 1.5 mm from the side surface of the substrate 10 toward the center of the substrate 10), the buffer layer 18 remains on the protective film 14, and there is at least one location where the total film thickness T of the protective film 14 and the buffer layer 18 is 4.5 nm or more. As a result, in the region R from which the resist film 26 has been removed by the edge rinse, the sufficiently large total film thickness T of the protective film 14 and the buffer layer 18 can be ensured. Therefore, generation of the isolated island-shaped protective film 14 can be more reliably prevented. Note that, in a range of 0.5 mm or less from the side surface of the substrate 10 toward the center of the substrate 10, the total film thickness T of the protective film 14 and the buffer layer 18 is preferably 5.0 nm or more, and more preferably 5.5 nm or more. In addition, the total film thickness T is preferably 35 nm or less, and more preferably 30 nm or less.

In the reflective mask blank 100 of the present embodiment, the total film thickness of the protective film 14 and the buffer layer 18 at the center of the substrate 10 is preferably 4.5 nm or more, and more preferably 5.5 nm or more. In addition, the total film thickness is preferably 35 nm or less, and more preferably 30 nm or less. When the protective film 14 and the buffer layer 18 satisfy such a condition, also in the region R from which the resist film 26 has been removed by the edge rinse, the sufficiently large total film thickness T of the protective film 14 and the buffer layer 18 can be ensured. Therefore, generation of the isolated island-shaped protective film 14 can be more reliably prevented.

Note that, in the present specification, the center of the substrate 10 means the position of the center of gravity (the position of a point on a main surface 10*a* of the substrate 10 corresponding to the position of the center of gravity) in the rectangular (for example, square) substrate 10. A side surface 10*b* of the substrate 10 is a surface substantially perpendicular to the two main surfaces of the substrate 10, and may be referred to as a "T surface". The "outer peripheral end" of a film or a layer means an end portion of the film or the layer at a position farthest from the center of the substrate 10.

A film forming region (a distance from the center of the substrate to the outer peripheral end), an inclined cross-sectional shape (gradient profile), and the like of the protective film 14, the buffer layer 18, the absorption layer 20, and the etching mask film 24 in the outer peripheral end portion of the substrate 10 can be appropriately adjusted by an opening dimension of a PVD shield, a tapered shape of an opening, an interval between the shield and the substrate, and the like.

FIGS. 4 to 11 are schematic diagrams for explaining a magnitude relationship among the protective film 14, the buffer layer 18, the absorption layer 20, then etching mask film 24, and the resist film 26 in the reflective mask blank 100 of the present embodiment. Note that, in FIGS. 4 to 11, the thickness of each of the layers is substantially constant toward an outer peripheral end thereof for simplification of the drawings.

Here, a distance from the center of the substrate 10 to the outer peripheral end of each of the layers is defined as follows.

- Lcap: a distance from the center of the substrate 10 to the outer peripheral end of the protective film 14
- Lbuf: a distance from the center of the substrate 10 to the outer peripheral end of the buffer layer 18
- Labs: a distance from the center of the substrate 10 to the outer peripheral end of the absorption layer 20
- Letc: a distance from the center of the substrate 10 to the outer peripheral end of the etching mask film 24
- Lres: a distance from the center of the substrate 10 to the outer peripheral end of the resist film 26

Figure 4:
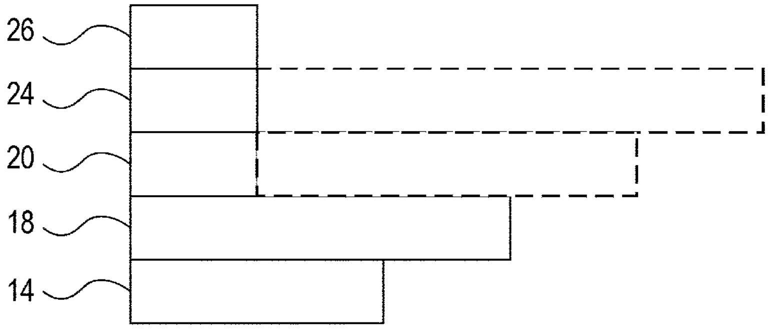
FIG. 4 is a schematic diagram for explaining a magnitude relationship among a protective film, a buffer layer, an absorption layer, an etching mask film, and a resist film.

In FIG. 4, Lres<Lcap<Lbuf<Labs<Letc is satisfied.

At the time of dry etching for forming the reference mark FM, since the etching mask film 24 and the absorption layer 20 not covered with the resist film 26 are removed by etching, a region surrounded by a dotted line in FIG. 4 is removed. Even in this case, since a state in which the entire surface of the protective film 14 is covered with the buffer layer 18 is maintained, it is possible to prevent generation of an "isolated island-shaped protective film" by the protective film 14 being damaged by etching.

Figure 5:
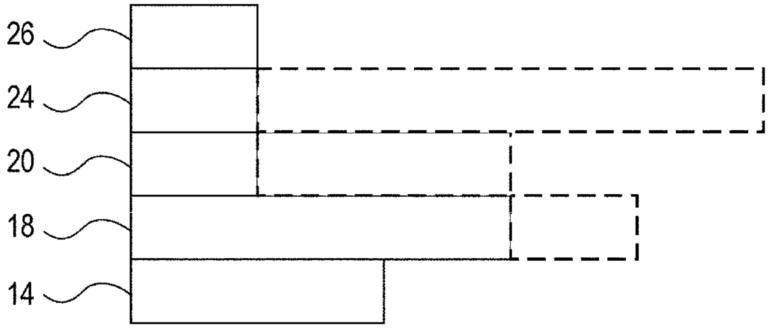
FIG. 5 is a schematic diagram for explaining a magnitude relationship among a protective film, a buffer layer, an absorption layer, an etching mask film, and a resist film.

In FIG. 5, Lres<Lcap<Labs<Lbuf<Letc is satisfied.

At the time of dry etching for forming the reference mark FM, the etching mask film 24 not covered with the resist film 26 is removed by dry etching. When the etching mask film 24 and the buffer layer 18 are etched by the same etchant (for example, when the etching mask film 24 and the buffer layer 18 are made of the same material), the buffer layer 18 not covered with the absorption layer 20 is etched by the same etchant as that of the etching mask film 24 (That is, the buffer layer 18 and the etching mask film 24 are simultaneously etched). Thereafter, since the absorption layer 20 not covered with the resist film 26 is etched by dry etching, a region surrounded by a dotted line in FIG. 5 is removed. Even in this case, since a state in which the entire surface of the protective film 14 is covered with the buffer layer 18 is maintained, it is possible to prevent generation of an "isolated island-shaped protective film" by the protective film 14 being damaged by etching.

Figure 6:
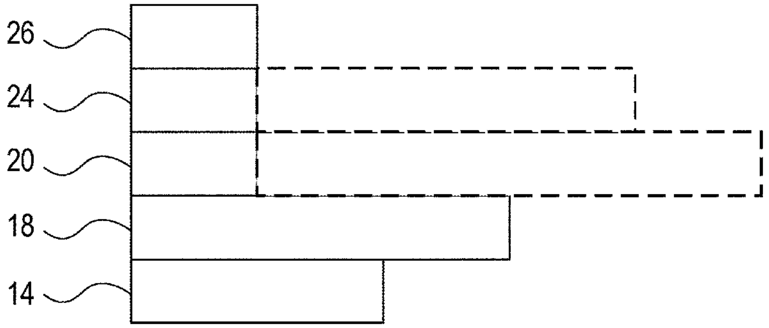
FIG. 6 is a schematic diagram for explaining a magnitude relationship among a protective film, a buffer layer, an absorption layer, an etching mask film, and a resist film.

In FIG. 6, Lres<Lcap<Lbuf<Letc<Labs is satisfied.

At the time of dry etching for forming the reference mark FM, since the etching mask film 24 and the absorption layer 20 not covered with the resist film 26 are removed by etching, a region surrounded by a dotted line in FIG. 6 is removed. Even in this case, since a state in which the entire surface of the protective film 14 is covered with the buffer layer 18 is maintained, it is possible to prevent generation of an "isolated island-shaped protective film" by the protective film 14 being damaged by etching.

Figure 7:
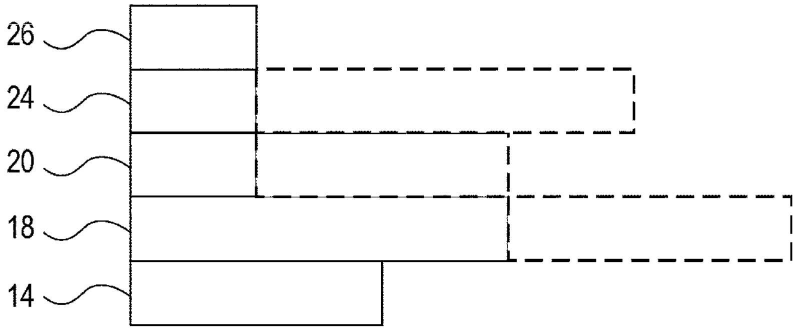
FIG. 7 is a schematic diagram for explaining a magnitude relationship among a protective film, a buffer layer, an absorption layer, an etching mask film, and a resist film.

In FIG. 7, Lres<Lcap<Labs<Letc<Lbuf is satisfied.

At the time of dry etching for forming the reference mark FM, the etching mask film 24 not covered with the resist film 26 is removed by dry etching. When the etching mask film 24 and the buffer layer 18 are etched by the same etchant (for example, when the etching mask film 24 and the buffer layer 18 are made of the same material), the buffer layer 18 not covered with the absorption layer 20 is etched by the same etchant as that of the etching mask film 24 (That is, the buffer layer 18 and the etching mask film 24 are simultaneously etched). Thereafter, since the absorption layer 20 not covered with the resist film 26 is etched by dry etching, a region surrounded by a dotted line in FIG. 7 is removed.

Even in this case, since a state in which the entire surface of the protective film 14 is covered with the buffer layer 18 is maintained, it is possible to prevent generation of an “isolated island-shaped protective film” by the protective film 14 being damaged by etching.

Figure 8:
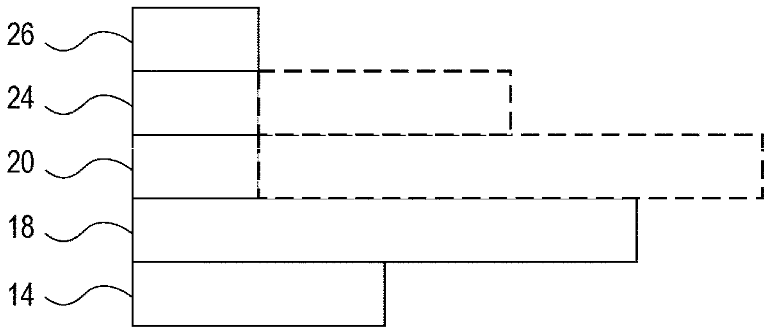
FIG. 8 is a schematic diagram for explaining a magnitude relationship among a protective film, a buffer layer, an absorption layer, an etching mask film, and a resist film.

In FIG. 8, Lres<Lcap<Letc<Lbuf<Labs is satisfied.

At the time of dry etching for forming the reference mark FM, since the etching mask film 24 and the absorption layer 20 not covered with the resist film 26 are removed by etching, a region surrounded by a dotted line in FIG. 8 is removed. Even in this case, since a state in which the entire surface of the protective film 14 is covered with the buffer layer 18 is maintained, it is possible to prevent generation of an “isolated island-shaped protective film” by the protective film 14 being damaged by etching.

Figure 9:
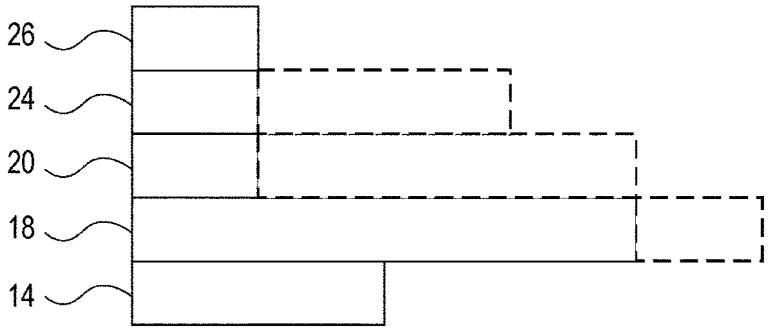
FIG. 9 is a schematic diagram for explaining a magnitude relationship among a protective film, a buffer layer, an absorption layer, an etching mask film, and a resist film.

In FIG. 9, Lres<Lcap<Letc<Labs<Lbuf is satisfied.

At the time of dry etching for forming the reference mark FM, the etching mask film 24 not covered with the resist film 26 is removed by dry etching. When the etching mask film 24 and the buffer layer 18 are etched by the same etchant (for example, when the etching mask film 24 and the buffer layer 18 are made of the same material), the buffer layer 18 not covered with the absorption layer 20 is etched by the same etchant as that of the etching mask film 24 (That is, the buffer layer 18 and the etching mask film 24 are simultaneously etched). Thereafter, since the absorption layer 20 not covered with the resist film 26 is etched by dry etching, a region surrounded by a dotted line in FIG. 9 is removed. Even in this case, since a state in which the entire surface of the protective film 14 is covered with the buffer layer 18 is maintained, it is possible to prevent generation of an “isolated island-shaped protective film” by the protective film 14 being damaged by etching.

Figure 10:
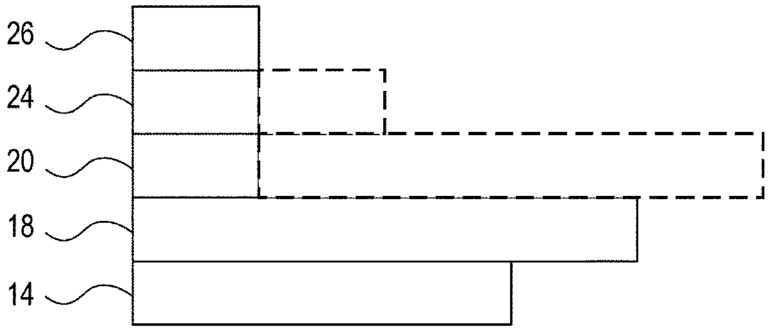
FIG. 10 is a schematic diagram for explaining a magnitude relationship among a protective film, a buffer layer, an absorption layer, an etching mask film, and a resist film.

In FIG. 10, Lres<Letc<Lcap<Lbuf<Labs is satisfied.

At the time of dry etching for forming the reference mark FM, since the etching mask film 24 and the absorption layer 20 not covered with the resist film 26 are removed by etching, a region surrounded by a dotted line in FIG. 10 is removed. Even in this case, since a state in which the entire surface of the protective film 14 is covered with the buffer layer 18 is maintained, it is possible to prevent generation of an “isolated island-shaped protective film” by the protective film 14 being damaged by etching.

Figure 11:
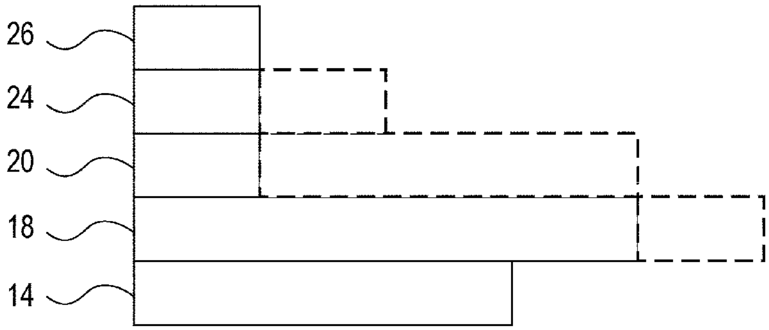
FIG. 11 is a schematic diagram for explaining a magnitude relationship among a protective film, a buffer layer, an absorption layer, an etching mask film, and a resist film.

In FIG. 11, Lres<Letc<Lcap<Labs<Lbuf is satisfied.

At the time of dry etching for forming the reference mark FM, the etching mask film 24 not covered with the resist film 26 is removed by dry etching. When the etching mask film 24 and the buffer layer 18 are etched by the same etchant (for example, when the etching mask film 24 and the buffer layer 18 are made of the same material), the buffer layer 18 not covered with the absorption layer 20 is etched by the same etchant as that of the etching mask film 24 (That is, the buffer layer 18 and the etching mask film 24 are simultaneously etched). Thereafter, since the absorption layer 20 not covered with the resist film 26 is etched by dry etching, a region surrounded by a dotted line in FIG. 11 is removed. Even in this case, since a state in which the entire surface of the protective film 14 is covered with the buffer layer 18 is maintained, it is possible to prevent generation of an “isolated island-shaped protective film” by the protective film 14 being damaged by etching.

In the reflective mask blank 100 of the present embodiment, Lcap≤Labs is preferably satisfied. When Lcap≤Labs is satisfied, even when the etching mask film 24 and the buffer layer 18 are etched by the same etchant, since a state in which the entire surface of the protective film 14 is covered with the buffer layer 18 is maintained, it is possible to more reliably prevent generation of an “isolated island-shaped protective film” by the protective film 14 being damaged by etching.

In the reflective mask blank 100 of the present embodiment, Lres<Lcap≤Lbuf is preferably satisfied. When the resist film 26 in the peripheral edge portion of the substrate 10 is removed by the edge rinse, Lres<Lcap is often satisfied. Even in this case, at the time of dry etching for forming the reference mark FM, since a state in which the entire surface of the protective film 14 is covered with the buffer layer 18 is maintained, it is possible to more reliably prevent generation of an “isolated island-shaped protective film” by the protective film 14 being damaged by etching.

<Method for Manufacturing Reflective Mask>

Using the reflective mask blank 100 of the present embodiment, the reflective mask 110 of the present embodiment can be manufactured. Hereinafter, an example of a method for manufacturing the reflective mask 110 will be described.

FIGS. 12A to 12F are schematic views illustrating an example of a method for manufacturing the reflective mask 110.

Figure 12A:
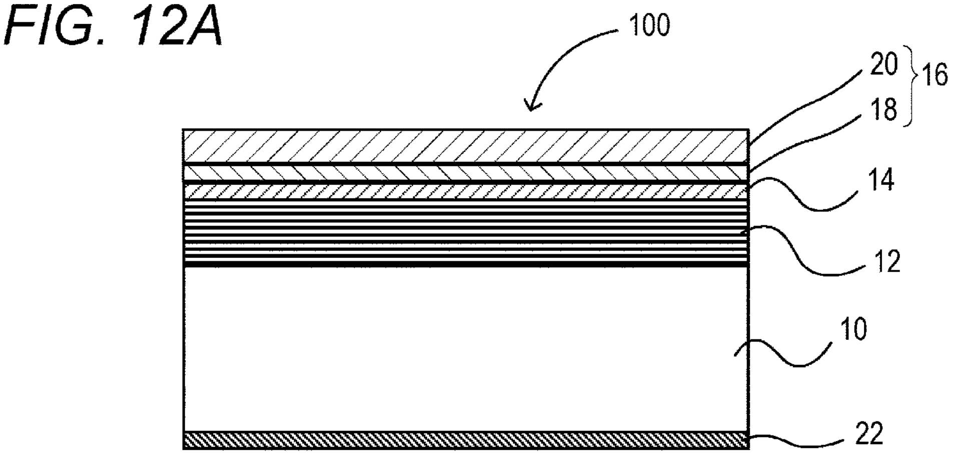
FIG. 12A is a schematic view illustrating an example of a method for manufacturing a reflective mask.
Figure 12B:
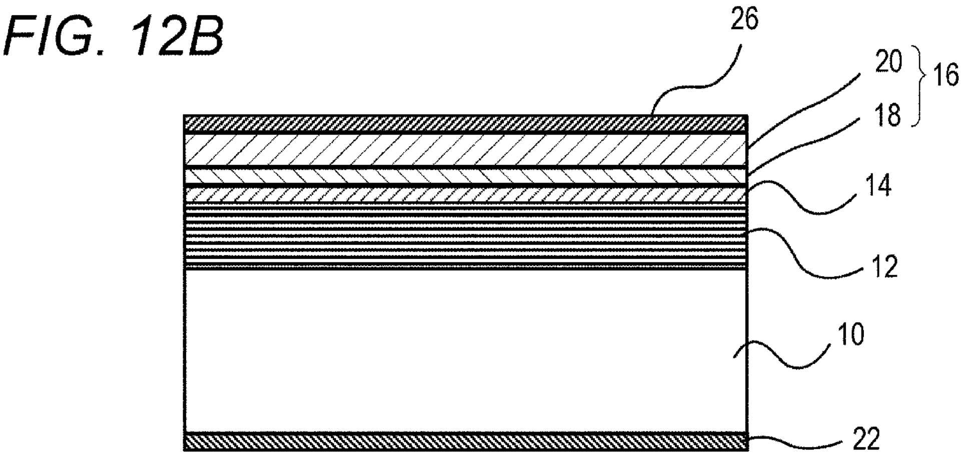
FIG. 12B is a schematic view further illustrating the example of the method for manufacturing a reflective mask.
Figure 12C:
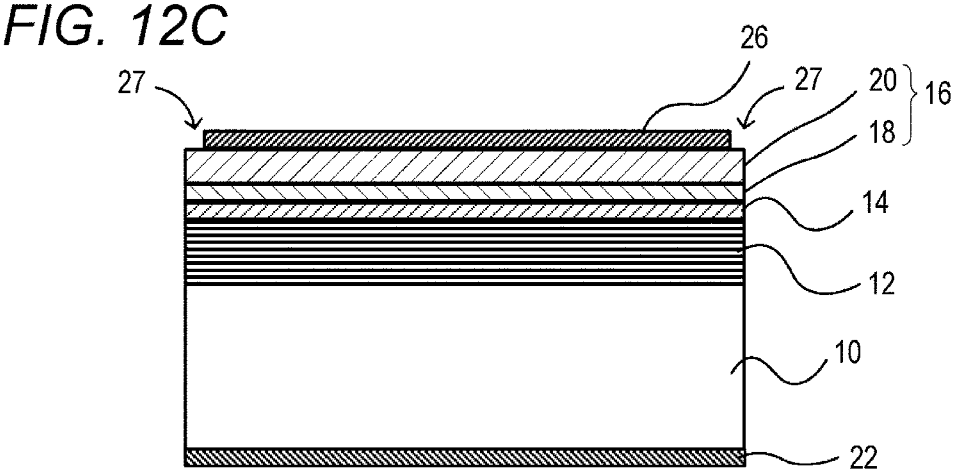
FIG. 12C is a schematic view further illustrating the example of the method for manufacturing a reflective mask.
Figure 12D:
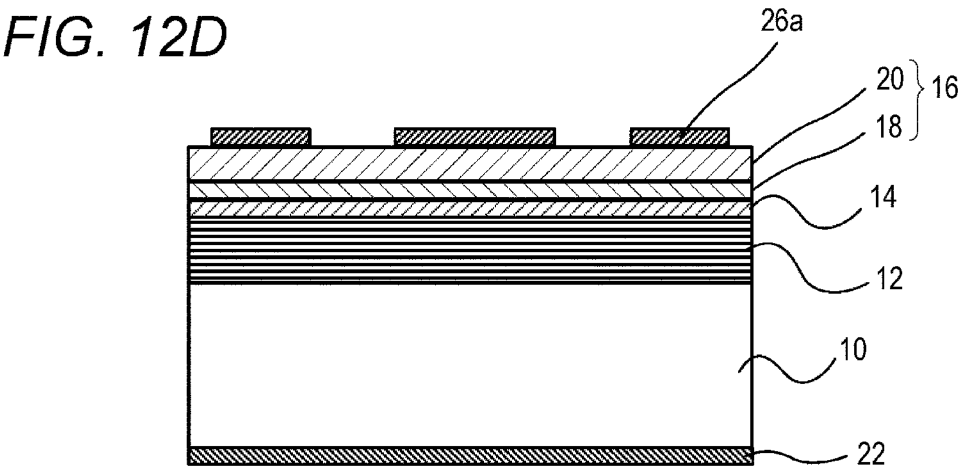
FIG. 12D is a schematic view further illustrating the example of the method for manufacturing a reflective mask.

As illustrated in FIG. 12A, first, the reflective mask blank 100 including the substrate 10, the multilayer reflective film 12 formed on a surface of the substrate 10, the protective film 14 formed on the multilayer reflective film 12, the absorber film 16 (the buffer layer 18 and the absorption layer 20) formed on the protective film 14, and the conductive back film 22 formed on a back surface of the substrate 10 is prepared (FIG. 12A). Next, the resist film 26 is formed on the absorber film 16 (FIG. 12B). In order to suppress generation of dust due to peeling of the resist film 26 in a substrate peripheral edge portion 27, the resist film 26 in the substrate peripheral edge portion 27 is removed with a solvent in which the resist film 26 is dissolved (edge rinse) (FIG. 12C). A pattern is drawn on the resist film 26 with an electron beam drawing device, and then the resulting product is subjected to a development and rinse step to form the resist pattern 26*a* (FIG. 12D).

Figure 12E:
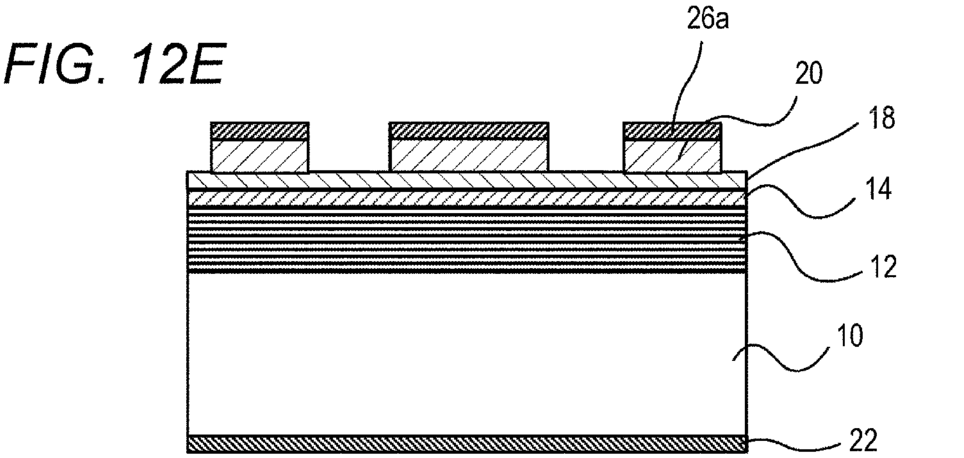
FIG. 12E is a schematic view further illustrating the example of the method for manufacturing a reflective mask.

The absorption layer 20 of the absorber film 16 is dry-etched using the resist pattern 26*a* as a mask. As a result, a portion not covered with the resist pattern 26*a* in the absorption layer 20 is etched to form a pattern on the absorption layer 20 (FIG. 12E).

As an etching gas for the absorption layer 20, for example, a fluorine-based gas and/or a chlorine-based gas can be used. As the fluorine-based gas, $CF_4$, $CHF_3$, $C_2F_6$, $C_3F_6$, $C_4F_6$, $C_4F_8$, $CH_2F_2$, $CH_3F$, $C_3F_8$, $SF_6$, $F_2$, or the like can be used. As the chlorine-based gas, $Cl_2$, $SiCl_4$, $CHCl_3$, $CCl_4$, $BCl_3$, or the like can be used. In addition, a mixed gas containing a fluorine-based gas and/or a chlorine-based gas and $O_2$ at a predetermined ratio can be used. These etching gases can each further contain an inert gas such as He and/or Ar, if necessary.

Figure 12F:
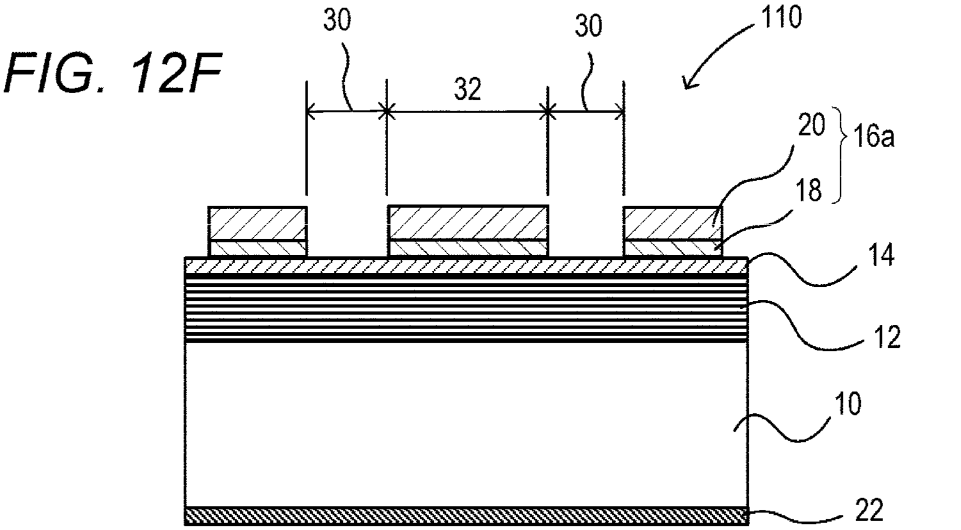
FIG. 12F is a schematic view further illustrating the example of the method for manufacturing a reflective mask.

After the pattern is formed on the absorption layer 20, the buffer layer 18 is patterned by dry etching to form the absorber pattern 16*a*. The resist pattern 26*a* is removed with a resist peeling liquid. After the resist pattern 26*a* is removed, the resulting product is subjected to a wet cleaning step using an acidic or alkaline aqueous solution to obtain the reflective mask 110 of the present embodiment (FIG. 12F).

Note that, when the reflective mask blank 100 in which the etching mask film 24 is formed on the absorber film 16 is used, a step of forming a pattern (etching mask pattern) on the etching mask film 24 using the resist pattern 26*a* as a mask and then forming a pattern on the absorption layer 20 using the etching mask pattern as a mask is added.

The reflective mask 110 thus obtained has a structure in which the multilayer reflective film 12, the protective film 14, and the absorber pattern 16*a* are layered on the substrate 10.

A region 30 where the multilayer reflective film 12 (including the protective film 14) is exposed has a function of reflecting EUV light. A region 32 in which the multilayer reflective film 12 (including the protective film 14) is covered with the absorber pattern 16*a* has a function of absorbing EUV light.

<Method for Manufacturing Semiconductor Device>

A transfer pattern can be formed on a semiconductor substrate by lithography using the reflective mask 110 of the present embodiment. This transfer pattern has a shape obtained by transferring a pattern of the reflective mask 110. By forming a transfer pattern on a semiconductor substrate with the reflective mask 110, a semiconductor device can be manufactured.

Figure 13:
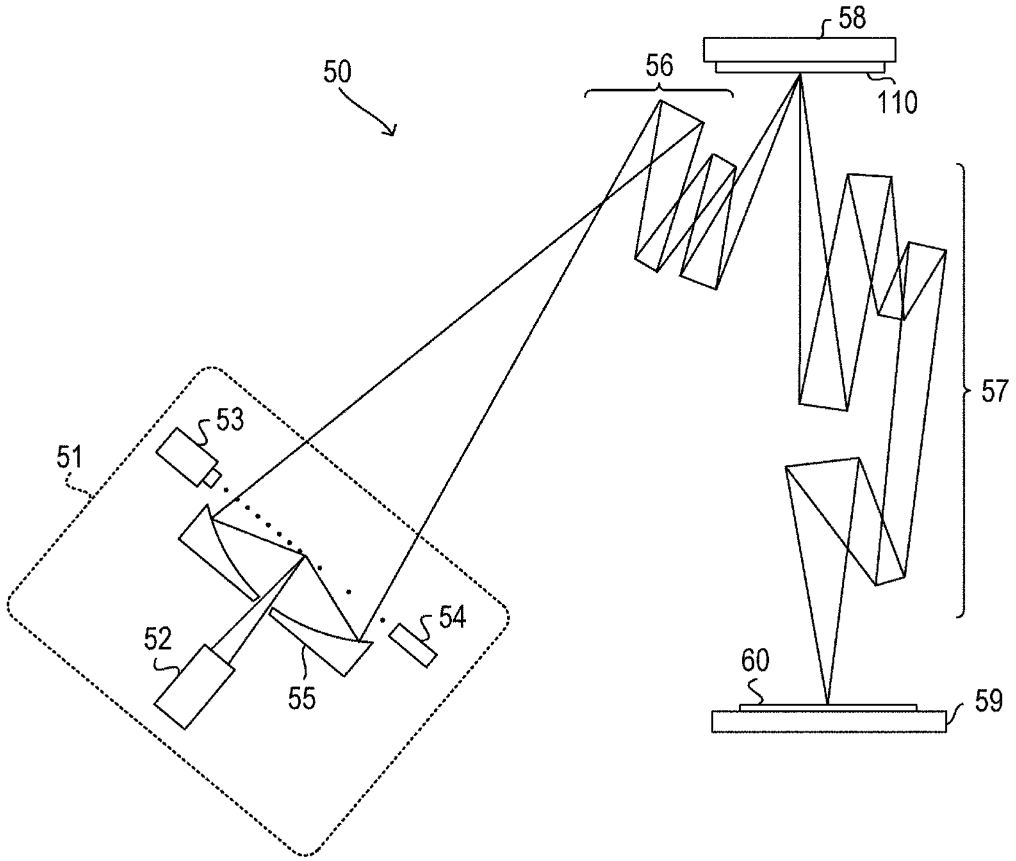
FIG. 13 is a diagram illustrating a schematic configuration of an EUV exposure apparatus.
Figure 14:
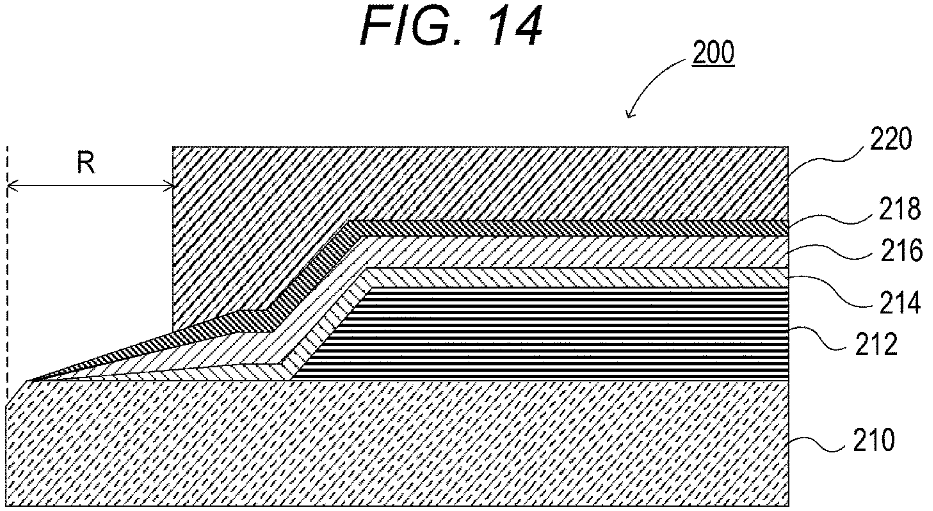
FIG. 14 is an enlarged cross-sectional view of an outer peripheral end portion of a conventional reflective mask blank.
Figure 15:
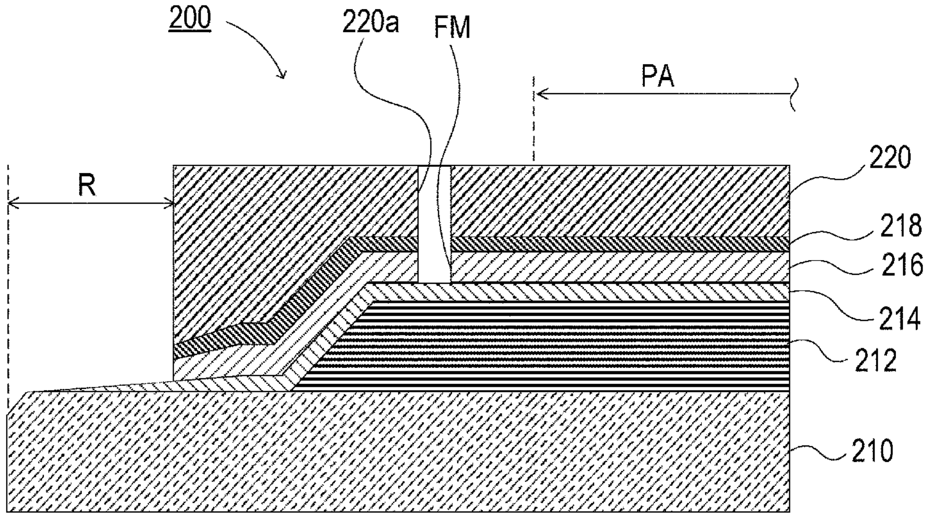
FIG. 15 is an enlarged cross-sectional view of the outer peripheral end portion of the conventional reflective mask blank in which a reference mark FM is formed.
Figure 16:
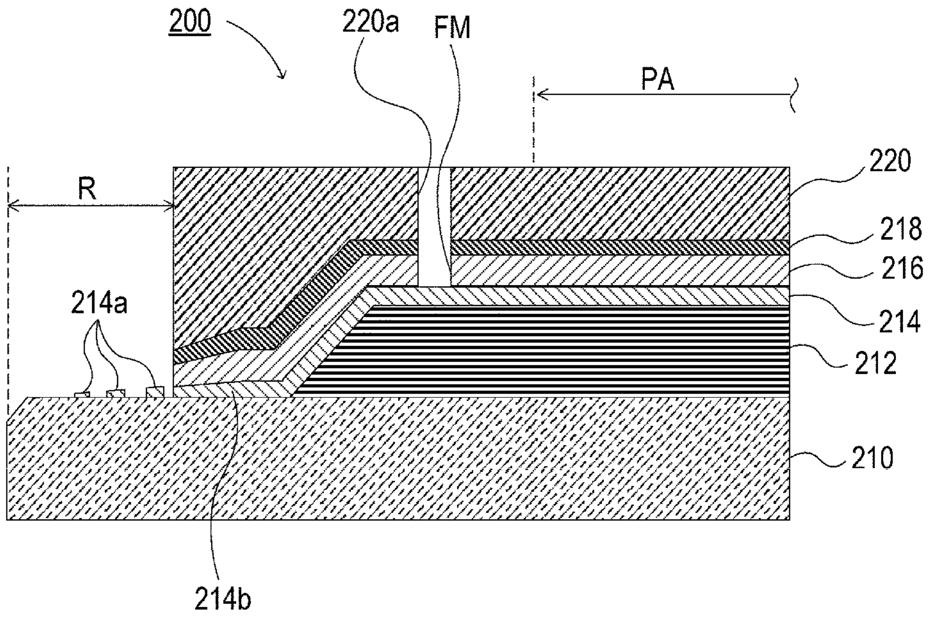
FIG. 16 is an enlarged cross-sectional view of the outer peripheral end portion of the conventional reflective mask blank in which an isolated island-shaped protective film is formed.

FIG. 13 illustrates a schematic configuration of an EUV exposure apparatus 50 that is an apparatus for transferring a transfer pattern onto a resist film formed on the semiconductor substrate 60. In the EUV exposure apparatus 50, an EUV light generation unit 51, an irradiation optical system 56, a reticle stage 58, a projection optical system 57, and a wafer stage 59 are precisely arranged along an optical path axis of EUV light. A container of the EUV exposure apparatus 50 is filled with a hydrogen gas.

The EUV light generation unit 51 includes a laser light source 52, a tin droplet generation unit 53, a catching unit 54, and a collector 55. When a tin droplet emitted from the tin droplet generation unit 53 is irradiated with a high-power carbon dioxide laser from the laser light source 52, tin in a droplet state is turned into plasma to generate EUV light. The generated EUV light is collected by the collector 55, passes through the irradiation optical system 56, and enters the reflective mask 110 set on the reticle stage 58. The EUV light generation unit 51 generates, for example, EUV light having a wavelength of 13.53 nm.

EUV light reflected by the reflective mask 110 is usually reduced to about ¼ of pattern image light by the projection optical system 57 and projected on the semiconductor substrate 60 (transferred substrate). As a result, a given circuit pattern is transferred onto the resist film on the semiconductor substrate 60.

The resist film that has been subjected to exposure is developed, whereby a resist pattern can be formed on the semiconductor substrate 60. By etching the semiconductor substrate 60 using the resist pattern as a mask, an integrated circuit pattern can be formed on the semiconductor substrate 60. A semiconductor device can be manufactured through such a step and other necessary steps.

EXAMPLES

Hereinafter, Example 1 to 3 and Comparative Example 1 will be described.

First, the substrate 10 having a 6025 size (about 152 mm×152 mm×6.35 mm) and having a polished main surface was prepared. The substrate 10 is a substrate made of low thermal expansion glass ($SiO_2$—$TiO_2$-based glass). The main surfaces of the substrate 10 were polished through a rough polishing step, a precision polishing step, a local processing step, and a touch polishing step.

Next, the multilayer reflective film 12 was formed on the main surface of the substrate 10. The multilayer reflective film 12 formed on the substrate 10 was the periodic multilayer reflective film 12 including Mo and Si in order to make the multilayer reflective film 12 suitable for EUV light having a wavelength of 13.5 nm. The multilayer reflective film 12 was formed by alternately building up a Mo film and a Si film on the substrate 10 using a Mo target and a Si target by an ion beam sputtering method using krypton (Kr) as a process gas. First, a Si film was formed with a thickness of 4.2 nm, and then a Mo film was formed with a thickness of 2.8 nm. This stack was counted as one period, and the Si film and the Mo film were built up for 40 periods in a similar manner. Then, finally, the Si film was formed with a thickness of 4.0 nm.

Next, on the multilayer reflective film 12, the protective film 14 made of RuNb was formed. The protective film 14 was formed by a magnetron sputtering method using a RuNb target in an Ar gas atmosphere. The protective film 14 had a film thickness (film thickness at the center of the substrate 10) of 3.5 nm.

Next, the buffer layer 18 was formed on the protective film 14. The composition and film thickness (film thickness at the center of the substrate 10) of the buffer layer 18 are presented in Table 1 below. The buffer layers 18 of Examples 1 and 3 and Comparative Example 1 were formed by a magnetron sputtering method using a Cr target in a mixed gas atmosphere of an Ar gas, an $O_2$ gas, and a $N_2$ gas. The buffer layers 18 of Example 2 was formed by a magnetron sputtering method using a TaB target in a mixed gas atmosphere of an Ar gas and an $O_2$ gas.

Next, the absorption layer 20 was formed on the buffer layer 18. The composition and film thickness of the absorption layer 20 are presented in Table 1 below. The absorption layers 20 of Examples 1 and 3 and Comparative Example 1 were formed by a magnetron sputtering method using a TaB target in a mixed gas atmosphere of an Ar gas and a $N_2$ gas. The absorption layer 20 of Example 2 was formed by a magnetron sputtering method using a RuCr target in an Ar gas atmosphere.

In Example 3, the etching mask film 24 made of CrON, of which the buffer layer 18 was made, was further formed on the absorption layer 20. The etching mask film 24 had a film thickness of 6 nm.

In Examples 1 and 2, each of the layers was formed so as to satisfy Lml<Lcap≤Lbuf≤Labs. In Example 3, each of the layers was formed so as to satisfy Lml<Lcap≤Lbuf<Labs=Letc. In Comparative Example 1, each of the layers was formed so as to satisfy Lml<Lbuf<Lcap. The meaning of each symbol is similar to the meaning defined above. Lml means a distance from the center of the substrate 10 to the outer peripheral end of the multilayer reflective film 12. Note that adjustment of a film formation range of each of the layers was performed by a method using a shielding member as disclosed in WO 2014/021235 A.

In Examples 1 to 3, as presented in Table 1, the protective film 14 and the buffer layer 18 were formed such that there was at least one location where a total film thickness of the protective film 14 and the buffer layer 18 was 4.5 nm or more in a range of 0.5 mm or less from the side surface of the substrate 10 toward the center of the substrate 10. In Comparative Example 1, the protective film 14 and the buffer layer 18 were formed such that there was not a location where a total film thickness of the protective film 14 and the buffer layer 18 was 4.5 nm or more in a range of 0.5 mm or less from the side surface of the substrate 10 toward the center of the substrate 10. Note that the film thickness of each of the layers in the outer peripheral end portion was adjusted by an opening dimension of a PVD shield by a magnetron sputtering method.

TABLE 1

| | Buffer layer | Film thickness (nm) of buffer layer | Total film thickness (nm) at outer peripheral end portion | Absorption layer | Film thickness (nm) of absorption layer |
|---|---|---|---|---|---|
| Example 1 | CrON | 6.0 | 6.4 | TaBN | 60 |
| Example 2 | TaBO | 3.5 | 4.7 | RuCr | 38 |
| Example 3 | CrON | 6.0 | 6.4 | TaBN | 60 |
| Comparative Example 1 | CrON | 6.0 | 2.5 | TaBN | 60 |

Next, the reflective mask 110 was manufactured using the reflective mask blank 100 prepared above.

Specifically, first, the resist film 26 was formed on the absorption layer 20 or the etching mask film 24. After the resist film 26 was formed, the resist film 26 in the substrate peripheral edge portion was removed with a resist peeling liquid (edge rinse). After the edge rinse was performed, a pattern was drawn on the resist film 26 by an electron beam drawing apparatus to form the resist pattern 26*a*. The absorption layer 20 was dry-etched using the resist pattern 26*a* as a mask to form the reference mark FM. Note that the absorption layers 20 of Examples 1 and 3 and Comparative Example 1 were dry-etched using a $Cl_2$ gas, and the absorption layer 20 of Example 2 was dry-etched using a mixed gas of a $Cl_2$ gas and an $O_2$ gas. In addition, in Example 3, the etching mask film 24 was dry-etched using a mixed gas of a $Cl_2$ gas and an $O_2$ gas using the resist pattern 26*a* as a mask to form an etching mask pattern, and then the absorption layer 20 was dry-etched using this etching mask pattern as a mask to form the reference mark FM.

After the reference mark FM was formed in the absorption layer 20, the resist pattern 26*a* on the absorption layer 20 or the etching mask film 24 was removed with a resist peeling liquid. Thereafter, a resist film for forming the absorber pattern 16*a* was formed on the absorption layer 20 or the etching mask film 24. A pattern was drawn on the resist film by an electron beam drawing apparatus to form a resist pattern, and then the absorption layer 20 and the buffer layer 18 were dry-etched using the resist pattern as a mask to form the absorber pattern 16*a*. Note that the absorption layers 20 of Examples 1 and 3 and Comparative Example 1 were dry-etched using a $Cl_2$ gas, and the buffer layers 18 of Examples 1 and 3 and Comparative Example 1 were dry-etched using a mixed gas of a $Cl_2$ gas and an $O_2$ gas. The absorption layer 20 of Example 2 was dry-etched using a mixed gas of a $Cl_2$ gas and an $O_2$ gas, and the buffer layer 18 of Example 2 was dry-etched using a $Cl_2$ gas. In Example 3, the etching mask film 24 was dry-etched using the resist pattern as a mask to form an etching mask pattern, then the absorption layer 20 was dry-etched using this etching mask pattern as a mask to remove the etching mask pattern simultaneously with dry etching of the buffer layer 18, thus forming the absorber pattern 16*a*.

An upper surface of an outermost peripheral portion of the reflective mask 110 thus obtained was observed with a TEM. As a result, in the reflective masks of Example 1 to 3, an isolated island-shaped protective film was not confirmed in the region R of the substrate peripheral edge portion. In addition, no trace of electrostatic breakdown caused by the isolated island-shaped protective film was confirmed.

Meanwhile, in the reflective mask of Comparative Example 1, an isolated island-shaped protective film was generated in the region R of the substrate peripheral edge portion. In addition, a trace of electrostatic breakdown caused by the isolated island-shaped protective film was confirmed.

REFERENCE SIGNS LIST

10 Substrate
12 Multilayer reflective film
14 Protective film
16 Absorber film
18 Buffer layer
20 Absorption layer
16*a* Absorber pattern
22 Conductive back film
24 Etching mask film
26*a* Resist pattern
26 Resist film
50 EUV exposure apparatus
100 Reflective mask blank
110 Reflective mask

The invention claimed is:

1. A reflective mask blank comprising: a substrate; a multilayer reflective film above the substrate; a protective film above the multilayer reflective film; and an absorber film above the protective film, wherein the absorber film comprises a buffer layer and an absorption layer formed above the buffer layer, a distance from a center of the substrate to an outer peripheral end of the protective film is denoted by Lcap, and a distance from the center of the substrate to an outer peripheral end of the buffer layer is denoted by Lbuf, and wherein Lcap≤Lbuf, and a combined film thickness of the protective film and the buffer layer is 4.5 nm or more in an area that is less than 0.5 nm from at least one edge of the substrate.

2. The reflective mask blank according to claim 1, wherein the buffer layer comprises at least one of tantalum (Ta), silicon (Si), chromium (Cr), iridium (Ir), platinum (Pt), palladium (Pd), zirconium (Zr), hafnium (Hf), and yttrium (Y).

3. The reflective mask blank according to claim 2, wherein a combined film thickness of the protective film and the buffer layer at the center of the substrate is 4.5 nm or more and 35 nm or less.

4. The reflective mask blank according to claim 2, wherein a distance from the center of the substrate to an outer peripheral end of the absorption layer is denoted by Labs, and wherein Lcap≤Labs.

5. The reflective mask blank according to claim 2, wherein the protective film comprises ruthenium (Ru).

6. The reflective mask blank according to claim 2, comprising a resist film above the absorber film, wherein a distance from the center of the substrate to an outer peripheral end of the resist film is denoted by Lres, and wherein Lres<Lcap≤Lbuf.

7. The reflective mask blank according to claim 1, wherein a combined film thickness of the protective film and the buffer layer at the center of the substrate is 4.5 nm or more and 35 nm or less.

8. The reflective mask blank according to claim 7, wherein a distance from the center of the substrate to an outer peripheral end of the absorption layer is denoted by Labs, and wherein Lcap≤Labs.

9. The reflective mask blank according to claim 7, wherein the protective film comprises ruthenium (Ru).

10. The reflective mask blank according to claim 1, wherein a distance from the center of the substrate to an outer peripheral end of the absorption layer is denoted by Labs, and wherein Lcap≤Labs.

11. The reflective mask blank according to claim 1, wherein the protective film comprises ruthenium (Ru).

12. The reflective mask blank according to claim 1, comprising a resist film above the absorber film, wherein a distance from the center of the substrate to an outer peripheral end of the resist film is denoted by Lres, and wherein Lres<Lcap≤Lbuf.

13. A reflective mask comprising: a substrate; a multilayer reflective film above the substrate; a protective film above the multilayer reflective film; and an absorber film with an absorber pattern above the protective film, wherein the absorber film with comprises a buffer layer and an absorption layer formed above the buffer layer, a distance from a center of the substrate to an outer peripheral end of the protective film is denoted by Lcap, and a distance from the center of the substrate to an outer peripheral end of the buffer layer is denoted by Lbuf, and wherein Lcap≤Lbuf, and a combined film thickness of the protective film and the buffer layer is 4.5 nm or more in an area that is less than 0.5 nm from at least one edge of the substrate.

14. The reflective mask according to claim 13, wherein a reference mark is formed in the absorption layer in the absorber film.

15. The reflective mask according to claim 13, wherein the buffer layer comprises at least one of tantalum (Ta), silicon (Si), chromium (Cr), iridium (Ir), platinum (Pt), palladium (Pd), zirconium (Zr), hafnium (Hf), and yttrium (Y).

16. The reflective mask according to claim 13, wherein a combined film thickness of the protective film and the buffer layer at the center of the substrate is 4.5 nm or more and 35 nm or less.

17. The reflective mask according to claim 13, wherein a distance from the center of the substrate to an outer peripheral end of the absorption layer is denoted by Labs, and wherein Lcap≤Labs.

18. The reflective mask according to claim 13, wherein the protective film comprises ruthenium (Ru).

* * * * *